United States Patent [19]

Echigo et al.

[11] 4,247,797
[45] Jan. 27, 1981

[54] RECTANGULAR AT-CUT QUARTZ RESONATOR

[75] Inventors: Naoyuki Echigo; Shiro Yamashita; Tsuneo Kuwabara; Kunihiro Takahashi; Shunichi Motte, all of Tokyo, Japan

[73] Assignee: Kabushiki Kaisha Daini Seikosha, Tokyo, Japan

[21] Appl. No.: 33,229

[22] Filed: Apr. 25, 1979

[30] Foreign Application Priority Data

May 19, 1978 [JP] Japan .................. 53/60284
May 19, 1978 [JP] Japan .................. 53/60285

[51] Int. Cl.³ .......................................... H01L 41/08
[52] U.S. Cl. .................................. 310/361; 310/368
[58] Field of Search .................... 310/360, 361, 368

[56] References Cited

U.S. PATENT DOCUMENTS

| 2,306,909 | 12/1942 | Sykes | 310/361 |
| 2,505,121 | 4/1950 | Knights | 310/361 X |
| 3,311,854 | 3/1967 | Mason | 310/361 X |
| 3,792,294 | 2/1974 | Royer | 310/361 |
| 4,071,786 | 1/1978 | Yamashita | 310/361 |
| 4,124,809 | 11/1978 | Engdahl | 310/361 |
| 4,167,686 | 9/1979 | Fukuyo | 310/361 |

*Primary Examiner*—Mark O. Budd
*Attorney, Agent, or Firm*—Robert E. Burns; Emmanuel J. Lobato; Bruce L. Adams

[57] ABSTRACT

A rectangular AT-cut quartz resonator comprising a quartz crystal plate rotated about 35° around the X-axis, has dimensional ratios w/t and l/t respectively in the range of 3.1 to 3.7 and 14.5 to 16.2, where the length l, width w and thickness t are respectively along the X-axis, Z-axis, and Y-axis.

4 Claims, 8 Drawing Figures

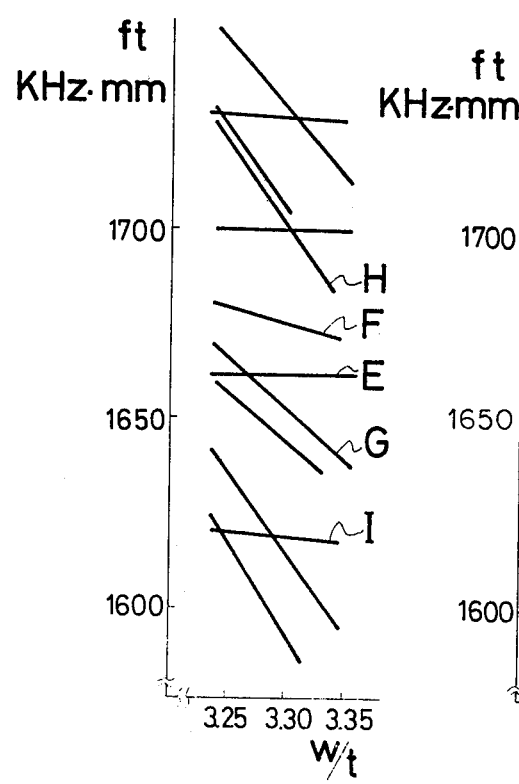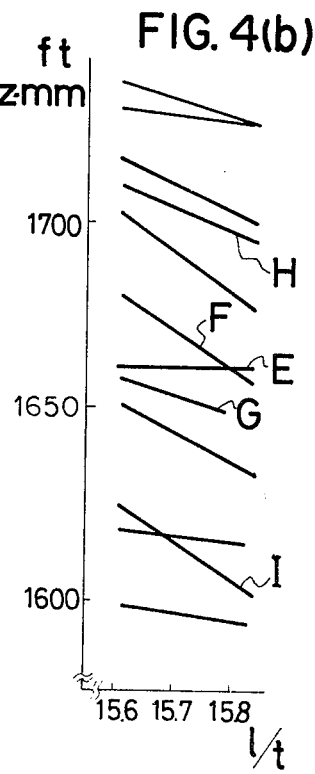
FIG. 4(a)
FIG. 4(b)

RECTANGULAR AT-CUT QUARTZ RESONATOR

BACKGROUND OF THE INVENTION

The present invention relates to a rectangular AT-cut quartz resonator, and more particularly to a rectangular AT-cut quartz resonator of miniature size, wherein spurious or unwanted resonance frequencies are remote from the main thickness-shear resonance frequency to thereby improve the quality factor of the main resonance and the frequency-temperature characteristics of a resonnce frequency.

Conventionally, AT-cut quartz resonators have been in popular use in communication instruments or the like on account of superior frequency-temperature characteristics, a high quality factor and a low equivalent resistance.

The AT-cut resonators conventionally used are disk shape in general, and the dimensional ratio of diameter to thickness is large and scarcely influenced by spurious resonances. However, as for a quartz resonator of miniature size for use in a wrist watch, since the coupling between thickness-shear resonance and the spurious resonances is strong, the quality factor and the frequency-temperature characteristics of the quartz resonator exceedingly deteriorate. Particularly, as for a small rectangular AT-cut quartz resonator already published in literature and the like, a mass-producible and practical one has not been obtained under the present conditions.

SUMMARY OF THE INVENTION

It is an object of the present invention to provide a rectangular AT-cut quartz resonator of miniature size having the high quality factor without being badly influenced by spurious resonances and having good frequency temperature characteristics, and moreover, mass-producible without impairing accuracy of finishing by overcoming the above mentioned disadvantages.

BRIEF DESCRIPTION OF THE DRAWINGS:

FIGS. 4a and 4b are mode charts showing frequency responses.

DESCRIPTION OF PREFERRED EMBODIMENTS

Hereafter, the present invention will be illustrated in conjunction with the accompanying drawings.

Figure 1:
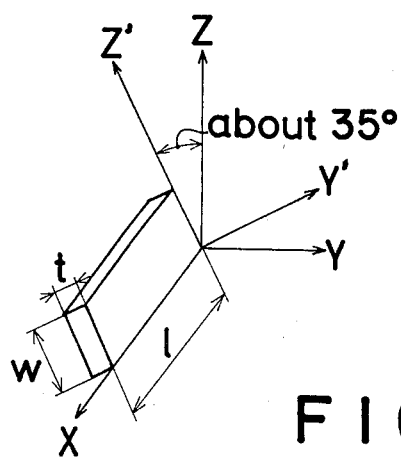
FIG. 1 shows the crystallographic axes of a rectangular AT-cut quartz resonator according to the present invention.

FIG. 1 shows crystallographic axes of a rectangular AT-cut quartz resonator according to the present invention. Numeral 1 is a quartz crystal plate, and with respect to the new axes X, Y' and Z', rotating the quartz crystal plate counterclockwise at about 35 degrees around the X-axis, the length l, the width w and the thickness t of the quartz crystal plate being respectively along the X-axis, Z'-axis and Y'-axis. A rectangular AT-cut quartz resonator is formed by providing the electrodes on both of the major surfaces of the X-Z' plane of the quartz crystal plate 1 by the evaporation or spattering method.

Figure 2:
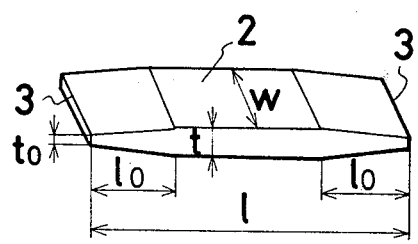
FIG. 2 shows a perspective view of a quartz resonator according to the present invention.

FIG. 2 is a perspective view of a rectangular AT-cut quartz resonator embodying the present invention, wherein numeral 2 is a quartz resonator and both end portions 3, 3 of the quartz resonator 2 in the length direction are bevelled. The reason why both end portions are bevelled is to weaken the coupling between the spurious resonances and the main resonance and to prevent deterioration of the quality factor when the quartz is supported. The end portions of the quartz resonator can be finished in the shape of a plano-bevel on one side or in the shape of a convex bevel (the shape of lenz), other than the shape of a bevel. A simple rectangular shape quartz resonator as the quartz crystal plate 1 in FIG. 1 is suitable for mass-production. A rectangular AT-cut quartz resonator is completed by the step of providing electrodes composed of a metalic film evaporated or spattered on surfaces both above and below the X-Z' plane of the quartz resonator 2 and the step of supporting the quartz resonator 2 by lead wires, and the further step of housing it in a capsule. The dimensions of the width w and the length l are the most important factor of the rectangular AT-cut quartz resonator. As for a quartz resonator of miniature size, the influential spurious resonance frequencies should be sufficiently away from the resonance frequency of a main thickness-shear resonance so as to eliminate the bad influences caused by the spurious resonances such as face vibration. Hence the length l should be determined in the first plate. The spurious resonance of strong response along the length is a flexural resonance $f = n/2l \sqrt{23} \tanh(nt/l)/\tau$, where f is a resonance frequency, $\tau$ the density of quartz and an order of mode n is an even number. If the order n is too small, the quality factor and the frequency temperature characteristics deteriorate, so it is preferable that n is more than 18 taking practicability into consideration. The flexural resonance frequency coincides with the main resonance frequency when n=18 and n=20, and then the dimensional ratio of the length-to-thickness l/t when n=18 and n=20 is calculated and the central value thereof is selected. The fundamental thickness-shear resonance frequency, that is a main resonance, is given by $f = 1/2t \sqrt{C'_{66}/\tau}$, where $C'_{66}$ is an elastic constant. In case of an AT-cut quartz resonator, l/t is calculated as 14.5 and 16.2 and it is preferable that l/t is chosen from the range of 14.5 to 16.2. Referring to the width w, in case of a miniature rectangular AT-cut quartz resonator, the width-shear resonance and the width-extensional resonance should be eliminated. At the same time, it is necessary to examine whether or not the variation of the frequency-temperature coefficient of the thickness-shear resonance frequency against the width dimension is to the extent practically used taking the tolerance into consideration.

Figure 3:
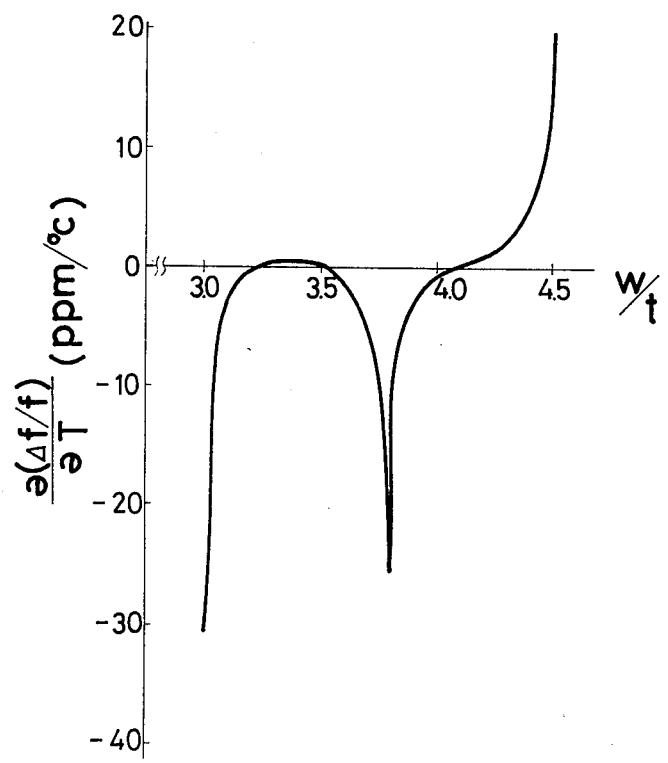
FIG. 3 is a correlation view showing the frequency-temperature coefficient against w/t with an embodiment of a rectangular AT-cut quartz resonator according to the present invention.

FIG. 3 is a correlation diagram between the frequency-temperature coefficient and w/t showing the inclination of the frequency temperature perature characteristics of the thickness-shear resonance at room temperature when the length-to-thickness ratio l/t of the quartz resonator 2 of the rectangular AT-cut quartz resonator shown in FIG. 2 is 15.7 and the width-to-thickness ratio w/t thereof varies in the range of 4.5 to 3.0.

The cut angle of the sample used in the investigation is 35°20'. As understood from the correlation diagram, the frequency temperature coefficient $2(\Delta f/f)/\delta t$ is discontinued when w/t is 3.0, 3.8 and 4.5. The cause of the discontinuity is assumed to be the above mentioned width-shear resonance and the width-extensional resonance. The width-shear resonance frequency is given by $f = n/2w \sqrt{C'_{55}/\tau}$ and the width-extensional resonance frequency is given by $f = n/2w\sqrt{C'_{33}/\tau}$. Then when the resonance frequencies of the two resonances equals with the resonance frequency of the thickness-shear resonance frequency, w/t is calculated as 1.5n and 1.9n. Though these resonances were considered to appear only when n is an odd number in general, the discontinued point in FIG. 3 coincides with the width-shear resonance of n=3 when w/t is 4.5 and coincides with the width-shear resonance of n=2 when w/t is 3.0. In case of the width-extensional resonance, w/t=3.8 in FIG. 3. That is to say, the width-extensional resonance and the width-shear resonance influence upon the frequency temperature coefficient of the thickness-shear resonance even in case n is an even number. As shown in the correlation diagram in FIG. 3, the accuracy of finishing becomes severe at the portion where the inclination of the frequency temperature coefficient is large, and thereby not suitable for mass-production. As shown in FIG. 3, w/t from the range of 3.1 to 3.7 is preferable as a region of small inclination. In order to fix the resonance frequency of the thickness-shear resonance to 4.2 MHz, the thickness t is about 0.4 mm and the tolerance of the width w is the realistic region.

The bad influence caused by the spurious resonances of high response upon the frequency-temperature characteristics and the quality factor of the quartz resonator can be eliminated in the above dimensional region. And in order to obtain better frequency-temperature characteristics and quality factor, the spurious resonances of weak response as well as the spurious resonances of high response should be eliminated.

Therefore, in order to study the spurious resonances of weak response in detail, as shown in the perspective view of the quartz resonator of FIG. 2, both the end portions 3, 3 of the quartz resonator 2 are chosen as follows; the bevel length $l_0$ is $l_0/l = 0.22$ and the thickness $t_0$ is $t_0/t = 0.45$. The central value of width-to-thickness ratio w/t 3.3 and that of the length-to-thickness ratio l/t 15.7 of the quartz resonator are chosen, and the sample of the quartz resonator is made with the length l and the width w at above and below the central value of 14.5 and 16.2 as mentioned above, and thereby the frequency response being measured is graphically shown in the mode charts in FIGS. 4a and 4b.

FIG. 4a shows the various resonance frequencies in a rectangular AT-cut resonator as a result of changing the ratio of the width-to-thickness, wherein the abscissa is w/t and the ordinate is a frequency constant ft. FIG. 4b shows the various resonance frequencies in a rectangluar AT-cut resonator as a result of changing the ratio of the length-to-thickness, wherein the abscissa is l/t. Lines in FIGS. 4a and 4b are actually measured values connected each other.

A line E in FIGS. 4a and 4b shows a fundamental thickness-shear resonance frequency of the main resonance, the frequency constant thereof is about 1665 KHz.mm. The lines other than the line E are all spurious resonances and though the mode of resonances thereof are indistinct, the inclination of the frequency constant against w/t and l/t can be obtained experimentally. The inclination of these lines are shown by lines inside the micro range, where the spurious resonance frequencies to be paid attention on determining w/t and l/t are straight lines F, G, H and I.

The frequency constants of these four spurious resonances are shown by functions of w/t and l/t as follows:
Straight line F: $f_F t = -78.8 w/t - 99.5 l/t + 3490$
Straight line G: $f_G t = -260 w/t - 47.3 l/t + 3250$
Straight line H: $f_H t = -412 w/t - 61.2 l/t + 4020$
Straight line I: $f_I t = -29.5 w/t - 102 l/t + 3320$ When the main resonance frequency constant is $f_E t$, the following equations should be satisfied.

$$f_E t \leq f_F t; \ f_E t \geq f_G t; \ f_E t \leq f_H t; \ f_E t \geq f_I t$$

where, $f_E t = 1665$ (KHz.mm) and since the rate of frequency deterioration caused by the thickness of the electrode of the resonance is larger than that of the spurious resonance, the frequency constant can be changed to the extent of 10 (KHz.mm). Accordingly, the above equations can be represented as follows:

$$f_E t - 10 \leq f_F t; \ f_E t + 10 \geq f_G t; \ f_E t - 10 \leq f_H t; \\ f_E t + 10 \geq f_I t$$

Accordingly,
$1655 \leq -78.8 w/t - 99.5 \ l/t + 3490$
$1675 \geq -260 w/t - 47.3 \ l/t + 3250$
$1655 \leq -412 w/t - 61.2 \ l/t + 4020$
$1675 \geq -29.5 w/t - 102 \ l/t + 3320$ When w/t and l/t satisfy the above four equations, the spurious resonances of large response can be eliminated and at the same time, as shown in the mode chart in FIG. 3, the main resonance frequency can be away from spurious resonance frequencies of weak response.

Figure 5:
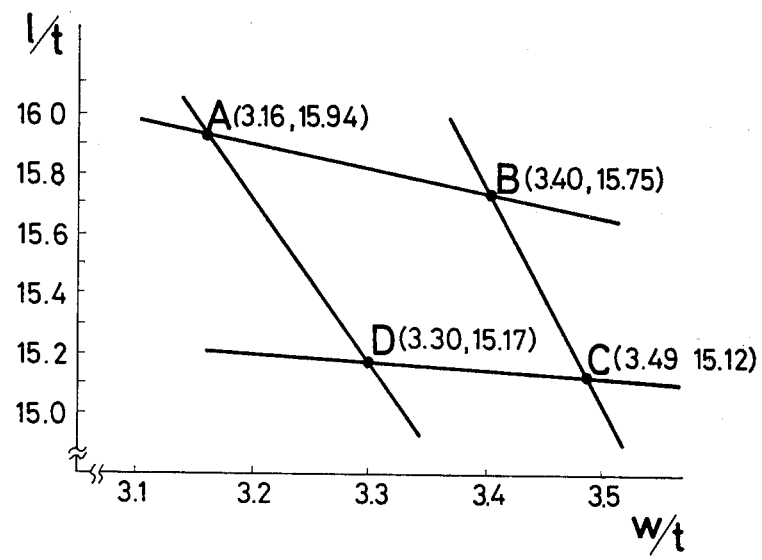
FIG. 5 shows a dimensional region of a quartz resonator according to the present invention.

FIG. 5 shows a region (w/t, l/t) which satisfies the above four equations, wherein the abscissa is w/t and the ordinate is l/t. If points are indicated by (w/t, l/t), A is (3.16, 15.94), B is (3.40, 15.75), C is (3.49, 15.52) and D is (3.30, 15.17). A region inside a quadrangle composed of the above points A, B, C and D satisfies the above mentioned four equations.

Figure 6:
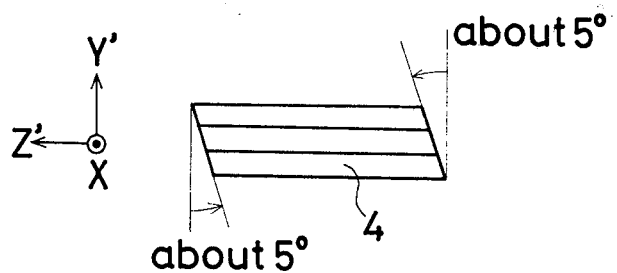
FIG. 6 shows a plan view showing the Y-Z' plane of a quartz resonator the side surfaces of which are tilted.

FIG. 6 is an embodiment of an AT cut quartz resonator according to the present invention showing both side surfaces of the resonator, i.e. the X-Y' planes, tilted at about 5 degrees with respect to the normal to the principal faces of the crystal, the angle being measured in a counterclockwise direction; around the X-axis.

The side surface of the quartz resonator is tilted in order to decide the frequency temperature characteristic of the quartz resonator equivalent to that of an infinite plate, since if the width-to-thickness ratio w/t of the quartz resonator becomes small, the inflexion temperature of the frequency temperature characteristic becomes higher than that of the infinite plate because of piezoelectric anisotropy. At this time the value of the width-to-thickness ratios of the region in FIG. 5 is decided using the width value of the upper or lower surface of X-Z' plane as shown in FIG. 6. Though both end portions in the length direction of the quartz resonator are bevelled in the experiment, when the length of the bevel $l_0/l = 0.22 \pm 0.04$ and the thickness of the end portion $t_0/t = 0.45 \pm 0.20$ are respectively chosen in FIG. 2, the region is approximately the same as the quadrangle shown in FIG. 5. The quartz resonator convexly processed in the shape of lenz, plano-bevelled and plano-convexly processed in one side can also be employed instead of bevel processing.

Figure 7:
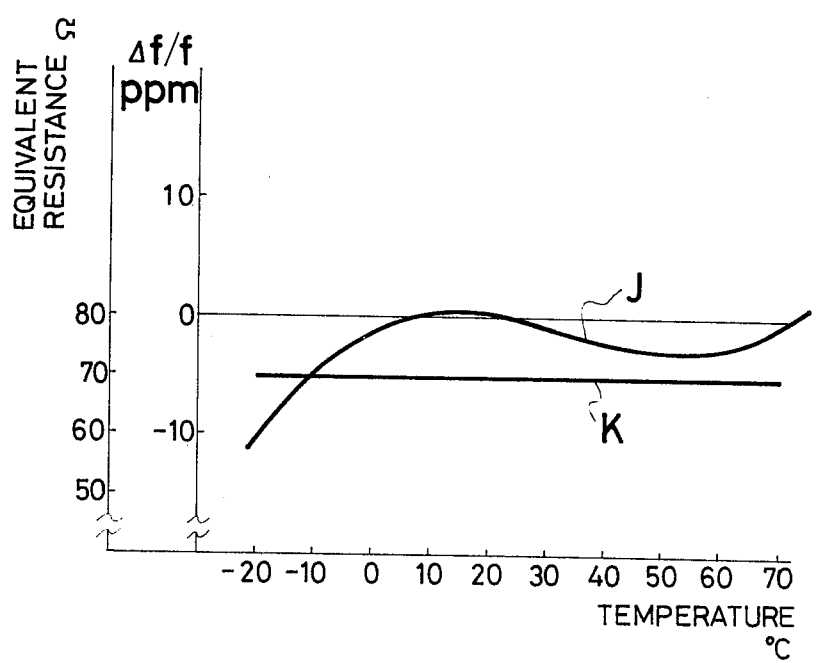
FIG. 7 shows a temperature characteristic of a rectangular AT-cut quartz resonator according to the present invention.

FIG. 7 is an embodiment of the temperature characteristic of the rectangular AT-cut quartz resonator according to the present invention, wherein J is the frequency temperature characteristic and k is the temperature characteristic of the equivalent resistance. The cut angle of the sample is 35°24′ and the optimum cut angle can be changed by changing the width of the quartz resonator. As shown in FIG. 7, the rectangluar AT-cut quartz resonator according to the present invention shows a good frequency-temperature characteristic and a flat temperature characteristic of the equivalent resistance.

The dimensional region in FIG. 5 is wide enough to maintain accuracy of finishing and mass-productivity, and when the main resonance frequency of the quartz resonator is about 4 MHz, the thickness thereof is about 0.4 mm, the width thereof is about 1.3 mm, the length thereof is about 6.2 mm and thereby a rectangluarAT-cur quartz resonator of exceedingly miniature size can be obtained.

It will thus be seen that, according to the present invention, a rectangular AT-cut quartz resonator of miniature size, which is scarcely subject to the bad influence caused by spurious resonances, having a good frequency temperature characteristic, a high quality factor, a good temperature characteristic of an equivalent resistance and mass-producible maintaining accuracy of finishing, can be obtained.

We claim:

1. A rectangular AT-cut quartz resonator rotating a quartz crystal plate counterclockwise at about 35 degrees around the X-axis, wherein the length l, the width w and the thickness t of the quartz crystal plate are respectively along the X-axis, Z′-axis and Y′-axis, and dimensional ratios w/t and l/t are respectively chosen from the range of 3.1 to 3.7 and the range of 14.5 to 16.2.

2. A rectangular AT-cut quartz resonator as claimed in claim 1, wherein the dimensional ratios w/t and l/t are chosen inside a quadrangle made of four points on coordinates composed of the abscissa w/t and the ordinate l/t (w/t, l/t): A(3.16, 15.94), B(3.40, 15.75), C(3.49, 15.12) and D(3.30, 15.17).

3. A rectangular AT-cut quartz resonator as claimed in claim 1, or claim 2, wherein both end portions in the length direction of the quartz resonator are finished into the shape of bevel or convex.

4. A rectangular AT-cut quartz resonator as claimed in claim 1 or claim 2, wherein both side surfaces of the quartz crystal resonator, that is the X-Y′ planes, are tilted at about 5 degrees with respect to the normal to the principal faces of the crystal, the angle being measured in a counterclockwise direction around the X-axis.

* * * * *